US012692625B1

(12) United States Patent
Sato et al.

(10) Patent No.: US 12,692,625 B1
(45) Date of Patent: ***Jul. 28, 2026

(54) GALLIUM NITRIDE SINGLE CRYSTAL SUBSTRATE

(71) Applicant: SUMITOMO CHEMICAL COMPANY, LIMITED, Tokyo (JP)

(72) Inventors: Takashi Sato, Hitachi (JP); Tetsuji Fujimoto, Hitachi (JP); Toshio Kitamura, Hitachi (JP); Masatomo Shibata, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 19/059,383

(22) Filed: Feb. 21, 2025

Related U.S. Application Data

(63) Continuation of application No. 18/619,371, filed on Mar. 28, 2024, now Pat. No. 12,258,678.

(30) Foreign Application Priority Data

May 12, 2023 (JP) ................................. 2023-079178

(51) Int. Cl.
　*B32B 3/02*　　　　(2006.01)
　*C30B 29/40*　　　　(2006.01)
(52) U.S. Cl.
　CPC .............. *C30B 29/406* (2013.01); *B32B 3/02* (2013.01)

(58) Field of Classification Search
　CPC ........... B32B 3/00; B32B 3/02; C30B 29/406
　See application file for complete search history.

(56) References Cited

U.S. PATENT DOCUMENTS

| | | |
|---|---|---|
| 2021/0292931 A1 | 9/2021 | Yoshida |
| 2023/0170213 A1 | 6/2023 | D'Evelyn et al. |
| 2023/0295839 A1 | 9/2023 | Fukutomi et al. |
| 2025/0263866 A1* | 8/2025 | Sato ........................ C30B 25/20 |
| 2025/0263867 A1* | 8/2025 | Sato .................. H01L 21/02389 |
| 2025/0263868 A1* | 8/2025 | Fujimoto ................ C30B 25/16 |

FOREIGN PATENT DOCUMENTS

JP 　　2020-33211 A 　　3/2020

* cited by examiner

*Primary Examiner* — Elizabeth E Mulvaney
(74) *Attorney, Agent, or Firm* — Birch, Stewart, Kolasch & Birch, LLP

(57) ABSTRACT

There is provided a gallium nitride single crystal substrate, which is a gallium nitride single crystal substrate that has a diameter of 50 mm or more and whose low index crystal plane closest to a main surface is a (0001) plane, wherein a density of etch pits when applying etching to the main surface with an alkaline etching solution is less than $1\times10^6$ $cm^{-2}$, and among peaks appearing in a histogram of diameters of the etch pits, when a diameter of a first peak appearing on a smallest diameter-side is a, a total number of the etch pits with a diameter exceeding 4a is $\frac{1}{1000}$ or less of a number of etch pits forming the first peak.

8 Claims, 8 Drawing Sheets

1

GALLIUM NITRIDE SINGLE CRYSTAL SUBSTRATE

CROSS REFERENCE TO RELATED APPLICATIONS

This application is a Continuation application of co-pending application Ser. No. 18/619,371, filed on Mar. 28, 2024, which claims the benefit under 35 U.S.C. § 119(a) to Patent Application No. 2023-079178, filed in Japan on May 12, 2023, all of which are hereby expressly incorporated by reference into the present application.

TECHNICAL FIELD

The present invention relates to a gallium nitride single crystal substrate.

DESCRIPTION OF RELATED ART

For example, Patent literature 1 discloses a method for manufacturing a gallium nitride single crystal substrate in which multiple valleys and multiple peaks are formed on the surface of a first layer, the method including: a step of preparing a base substrate composed of a single crystal of a group III nitride semiconductor, having a mirror-finished main surface, and in which a low-index crystal plane closest to the main surface is a (0001) plane; a first step of directly epitaxially growing a group III nitride semiconductor single crystal having a top surface with exposed (0001) plane on the main surface of the base substrate, creating multiple concave portions on the top surface, the concave portions being made up of inclined interfaces other than the (0001) plane, gradually expanding the inclined interface upward of the main surface of the base substrate, eliminating the (0001) plane from the top surface, and growing the first layer whose surface composed only of the inclined interface; and a second step of epitaxially growing the group III nitride semiconductor single crystal on the first layer, eliminating the inclined interface and growing a second layer having a mirror-finished surface, wherein in the first step, multiple concave portions are created on the top surface of the single crystal, and by eliminating the (0001) plane, the multiple valleys and multiple peaks are formed on the surface of the first layer.

[Patent literature 1] Japanese Patent Application Publication No. 2020-33211

SUMMARY OF THE INVENTION

An object of the present invention is to improve the characteristics of a device fabricated on a gallium nitride single crystal substrate.

According to one aspect of the present invention, there is provided a gallium nitride single crystal substrate, which is a gallium nitride single crystal substrate that has a diameter of 50 mm or more and whose low index crystal plane closest to a main surface is a (0001) plane, wherein a density of etch pits when applying etching to the main surface with an alkaline etching solution is less than $1 \times 10^6$ cm$^{-2}$, and among peaks appearing in a histogram of diameters of the etch pits, when a diameter of a first peak appearing on a smallest diameter-side is a, a total number of the etch pits with a diameter exceeding 4a is 1/1000 or less of a number of etch pits forming the first peak.

2

According to the present invention, the characteristics of a device fabricated on a gallium nitride single crystal substrate can be improved.

DETAILED DESCRIPTION OF THE INVENTION

Finding Obtained by the Inventor

Figure 1:
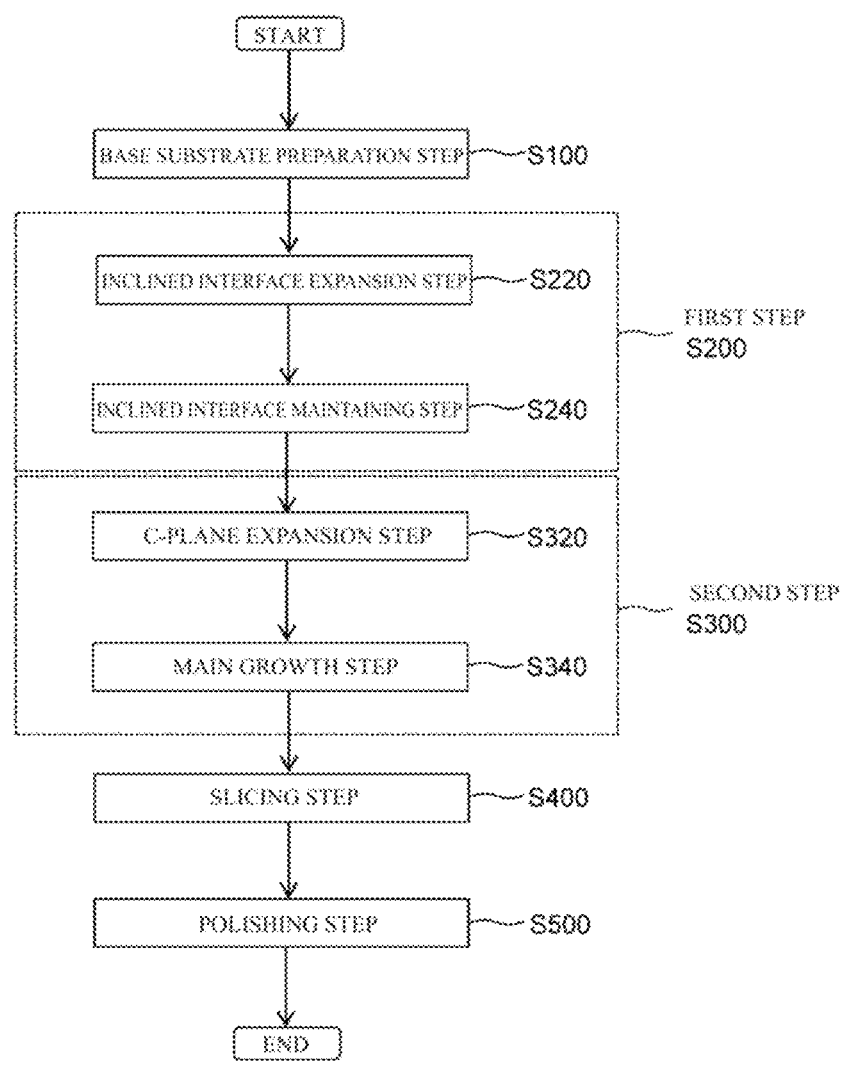
FIG. 1 is a flowchart showing a method for manufacturing a gallium nitride single crystal substrate according to an embodiment of the present invention.

First, the finding obtained by the inventors will be explained.

For example, it is found that when the c-plane of a gallium nitride (GaN) single crystal substrate is etched with an alkaline etching solution, etch pits corresponding to dislocations are formed. Those skilled in the art also know how to identify the type of the dislocations (edge-shaped, mixed, spiral) based on the size (diameter) of the etch pit. However, this method is not necessarily universally applicable. The reason is as follows. The size of the etch pit formed by alkaline etching corresponds to the amount of strain in a crystal lattice around a dislocation core. Accordingly, the size of the etch pit is determined not only by the type of the dislocation but also by impurities trapped in the dislocation, precipitates on the dislocation, distance from other dislocations, etc.

For the reason described above, although it is difficult to identify the type of the dislocation (edge-shaped, mixed, spiral) depending on the size of the etch pit, it can be said that dislocations that form large etch pits in size also have a large strain field around the dislocation core. The dislocation with a large strain field is likely to have a large Burgers vector, and such a dislocation tends to become a micropipe defect in which a dislocation core is hollow (hollow core) and become a path for abnormal diffusion of the impurities. The inventors have found that the dislocation with such a large strain field adversely affects the characteristics of a device fabricated on the gallium nitride single crystal substrate.

The size of the etch pit also largely depends on an etching condition. Therefore, it is meaningless to discuss an absolute value of the etch pit size. However, it is extremely likely that a smallest etch pit in size among the several types of etch pits of different sizes detected by etching, corresponds to an edge-shaped dislocation with a smallest strain field around the dislocation core. Therefore, the inventors investigated the histogram of the etch pit diameter, and among the peaks appearing in this histogram, checked the diameter and number of other etch pits using the diameter of a smallest peak as a reference, and have found a technique of determining the presence or absence of a dislocation defect that adversely affect the characteristics of the device fabricated on the gallium nitride single crystal substrate, and also found that when the diameter of a reference etch pit is a, the etch pits with diameters exceeding 4a correspond to the dislocations that have accumulated large strains as described above, and it is highly likely that such dislocations will have a negative impact on device properties.

Further, the inventors have conducted extensive research for a method for reducing (or eliminating) the dislocations that have accumulated large strains as described above. As a result, it is found that by doping an inclined interface growth region with germanium (Ge) at a high concentration in the step of growing the inclined interface as a growth plane (first step described below) as described in Patent Literature 1, a gallium nitride single crystal substrate with almost no large etch pits with a diameter of more than 4 mm (that is, with substantially no dislocations that have accumulated large strains that are likely to adversely affect the device characteristics) can be manufactured when etched with an alkaline etching solution.

One Embodiment of the Present Invention

Hereinafter, one embodiment of the present invention will be described with reference to the drawings.
(1) Method for Manufacturing a Gallium Nitride Single Crystal Substrate First, a method for manufacturing a gallium nitride single crystal substrate according to this embodiment will be described. FIG. 1 is a flowchart showing a method for manufacturing a gallium nitride single crystal substrate according to this embodiment. FIG. 2A to 2C, FIG. 3A, FIG. 3B, FIG. 4A, and FIG. 4B are schematic cross-sectional views showing a part of the method for manufacturing a gallium nitride single crystal substrate according to this embodiment. Further, in FIG. 3B, a thin solid line s indicates a crystal plane in the middle of growth, and in FIGS. 2C, 3A, 3B, 4A, and 4B, dotted lines indicate dislocations.

As shown in FIG. 1, the method for manufacturing a gallium nitride single crystal substrate according to this embodiment includes, for example, a base substrate preparation step S100, a first step S200, a second step S300, a slicing step S400, and a polishing step S500.
(S100: Base Substrate Preparation Step)

Figure 2A:
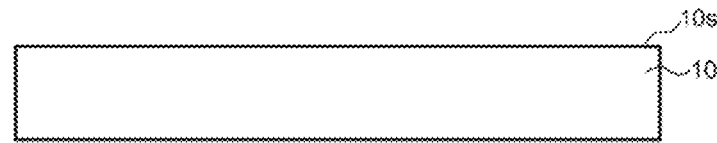
FIG. 2A is a schematic cross-sectional view showing a part of the method for manufacturing a gallium nitride single crystal substrate according to an embodiment of the present invention.

As shown in FIG. 2A, in the base substrate preparation step S100, a base substrate 10 comprising gallium nitride single crystal is prepared. In the base substrate preparation step S100 of this embodiment, a commercially available gallium nitride single crystal substrate (not a template, but a free-standing substrate) can be used as the base substrate 10. Further, the base substrate 10 comprising gallium nitride single crystal may be fabricated by the VAS (Void-Assisted Separation) method described in Patent Literature 1.

The base substrate 10 may be Ge-doped, Si-doped, or undoped, but a Ge-doped GaN layer is particularly preferable. Thereby, the difference in Ge concentration between the base substrate 10 and the first layer 30, which will be described later, can be reduced.

Hereinafter, in a GaN crystal having a wurtzite structure, <0001> axis is referred to as "c-axis" and (0001) plane is referred to as "c-plane." (0001) plane is sometimes referred to as "+c plane (gallium polar plane)" and (000-1) plane is sometimes referred to as "-c plane (nitrogen (N) polar plane)." Also, <1-100> axis is referred to as "m-axis" and {1-100} plane is referred to as "m-plane."

The m-axis may be expressed as <10-10> axis. Further, <11-20> axis is referred to as "a-axis" and {11-20} plane is referred to as "a-plane."
(S200: First Step (First Layer Growth Step))

Figure 2B:
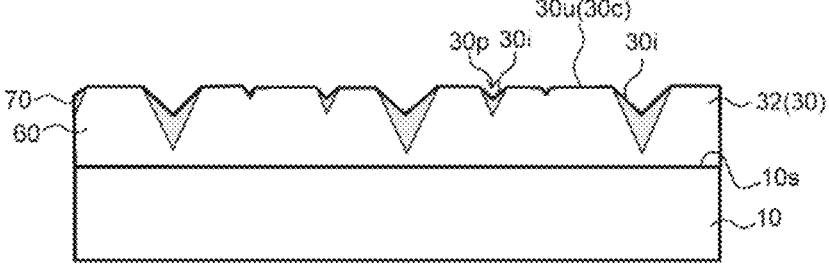
FIG. 2B is a schematic cross-sectional view showing a part of the method for manufacturing a gallium nitride single crystal substrate according to an embodiment of the present invention.

As shown in FIG. 2B, on the base substrate 10 prepared in the base substrate preparation step S100, a GaN single crystal having a top surface 30u with exposed c-plane 30c is epitaxially grown directly on the main surface 10s of the base substrate 10 by supplying GaCl gas and $NH_3$ gas to the heated base substrate 10 using, for example, the HVPE method. This causes the first layer 30 to grow.

Figure 2C:
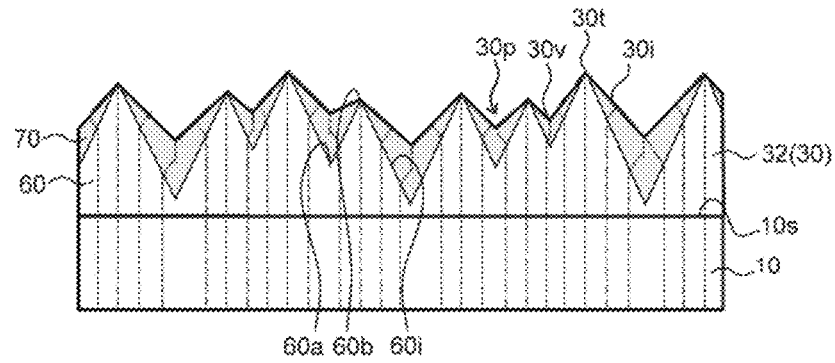
FIG. 2C is a schematic cross-sectional view showing a part of the method for manufacturing a gallium nitride single crystal substrate according to an embodiment of the present invention.

At this time, multiple concave portions 30p surrounded by inclined interfaces 30i other than the c-plane are formed on the top surface 30u of the single crystal, in such a manner as gradually expanding the inclined interface 30i upward of the main surface 10s of the base substrate 10 and gradually reducing the c-plane 30c. This causes the c-plane 30c to disappear from the top surface 30u. As a result, the first layer 30 whose surface is composed of only the inclined interface 30i grows as shown in FIG. 2C.

That is, in the first step S200, the first layer 30 is grown three-dimensionally as a single crystal so as to intentionally roughen the main surface 10s of the base substrate 10.

In the first step S200, for example, the first layer 30 is grown under a predetermined first growth condition. As the first growth condition of this embodiment, for example, the growth temperature in the first step S200 is set lower than the growth temperature in the second step S300, which will be described later. Specifically, the growth temperature in the first step S200 is, for example, 980° C. or more and 1,020° C. or less, preferably 1,000° C. or more and 1,020° C. or less.

Further, as the first growth condition of this embodiment, for example, the ratio of the supply rate of $NH_3$ gas as a nitriding agent gas to the supply rate of GaCl gas as a group III source gas (hereinafter also referred to as "V/III ratio")

in the first step S200, may be made larger than the V/III ratio in the second step S300, which will be described later. Specifically, the V/III ratio in the first step S200 is, for example, 2 or more and 20 or less, preferably 2 or more and 15 or less.

In this embodiment, the first layer 30 (particularly an inclined interface growth region 70 described below) is doped with Ge at a high concentration under a first growth condition. Thereby, on the surface of the second layer 40, which will be described later, it is possible to reduce dislocations that have accumulated large strains and effectively increase an abundance ratio of dislocations with small strain fields. Ge doping is performed using, for example, tetrachlorogermane (GeCl$_4$) gas. The GeCl$_4$ gas is supplied, for example, from a cylinder or by placing a raw material container in a constant temperature bath maintained at about 5° C. and bubbling GeCl$_4$ in a liquid state using a carrier gas. As the carrier gas, either H$_2$ gas or N$_2$ gas, or both can be used. In any case, an appropriate adjustment to set the Ge concentration in the first layer to be 30 is $3\times10^{18}$ to $9\times10^{20}$ cm$^{-3}$ is preferable by controlling the flow rate using a mass flow controller so that a partial pressure of GeCl$_4$ gas is 0.3 to 30 Pa.

Other conditions among the first growth condition of this embodiment are, for example, as follows.

Growth pressure: 90 to 105 kPa, preferably 90 to 95 kPa

Partial pressure of GaCl gas: 1.5-15 kPa

N$_2$ gas flow rate/H$_2$ gas flow rate: 0 to 1

Partial pressure of GeCl$_4$ gas: 0.3 to 30 Pa

Here, the first step S200 of this embodiment is classified into two steps based on, for example, the form of the first layer 30 during growth. Specifically, the first step S200 of this embodiment includes, for example, an inclined interface expansion step S220 and an inclined interface maintaining step S240. Through these steps, the first layer 30 includes, for example, an inclined interface expanding layer 32 and an inclined interface maintaining layer 34.

(S220: Inclined Interface Expansion Step)

First, as shown in FIG. 2B, the inclined interface expanding layer 32 of the first layer 30 comprising GaN single crystal is epitaxially grown directly on the main surface 10s of the base substrate 10 under the above-described first growth condition.

In an initial stage of the growth of the inclined interface expanding layer 32, the inclined interface expanding layer 32 grows in a normal direction (direction along the c-axis) of the main surface 10s of the base substrate 10, using the c-plane 30c as a growth plane.

As shown in FIG. 2B, by gradual growth of the inclined interface expanding layer 32 under the first growth condition, multiple concave portions 30p constituted by inclined interfaces 30i other than the c-plane are formed on the top surface 30u of the inclined interface expanding layer 32, with the c-plane 30c exposed. Multiple concave portions 30p constituted by inclined interfaces 30i other than the c-plane are randomly formed on the top surface 30u. Thereby, the inclined interface expanding layer 32 is formed in which the c-plane 30c and the inclined interface 30i other than the c-plane coexist on the surface.

The "inclined interface 30i" here means a growth interface that is inclined with respect to the c-plane 30c, and includes a low index facet other than the c-plane, a high index facet other than the c-plane, or an inclined plane that cannot be represented by a plane index. Facets other than the c-plane are, for example, {11-2m}, {1-10n}, etc., wherein m and n are integers other than 0.

With further growth of the inclined interface expanding layer 32 under the first growth condition, as shown in FIG. 2B, the inclined interface 30i other than the c-plane is gradually expanded, and the c-plane 30c is gradually reduced upward of the base substrate 10 in the inclined interface expanding layer 32. At this time, an inclination angle formed by the inclined interface 30i with respect to the main surface 10s of the base substrate 10 gradually becomes smaller upward of the base substrate 10. Thereby, most of the inclined interface 30i finally becomes a {11-2m} plane satisfying m≥3.

With further growth of the inclined interface expanding layer 32, as shown in FIG. 2C, the c-plane 30c of the inclined interface expanding layer 32 disappears from the top surface 30u, and the surface of the inclined interface expanding layer 32 is composed of only the inclined interface 30i. Thereby, a mountain-shaped inclined interface expanding layer 32 in which pyramids are continuously connected is formed.

In this embodiment, in the initial stage of the growth of the inclined interface expanding layer 32, the inclined interface expanding layer 32 is grown to a predetermined thickness on the main surface 10s of the base substrate 10 using the c-plane 30c as a growth plane without creating the inclined interface 30i, and thereafter the inclined interface 30i other than the c-plane is created on the surface of the inclined interface expanding layer 32. Thereby, multiple valleys 30v are formed at positions upwardly away from the main surface 10s of the base substrate 10. At this time, when using the Ge-doped base substrate 10, it is preferable that a difference in the Ge concentration between the base substrate 10 and the region that grows using the c-plane 30c as a growth plane, is adjusted to be for example, $1\times10^{18}$ cm$^{-3}$ or less.

Through the growth process of the inclined interface expanding layer 32 as described above, dislocations propagate in a bent manner as described below. Specifically, as shown in FIG. 2C, multiple dislocations extending in the direction along the c-axis within the base substrate 10 propagate from the base substrate 10 toward a direction along the c-axis of the inclined interface expanding layer 32. In the region of the inclined interface expanding layer 32, that grows using the c-plane 30c as a growth plane, dislocations propagate from the base substrate 10 in a direction along the c-axis of the inclined interface expanding layer 32. However, when the inclined interface expands and the growth plane of the dislocations propagating in the direction along the c-axis changes to the inclined interface 30i, the dislocations bend and propagate in a direction substantially perpendicular to the inclined interface 30i. That is, the dislocations propagate in a bent direction with respect to the c-axis. Thereby, in the steps after the inclined interface expansion step S220, the dislocations locally gather approximately at the center of the multiple concave portions 30p formed by the inclined interface 30i. Among the dislocations that gather approximately at the center of the concave portions 30p, dislocations having mutually opposing Burgers vectors disappear when they associate with each other. Further, some of them form dislocation loops and are inhibited from propagating in the direction along the c-axis. As a result, the dislocation density on the surface of the second layer 40, which will be described later, can be reduced. On the other hand, dislocations that do not associate with other dislocations continue to propagate, and some dislocations associate with other dislocations and progress while forming an even larger Burgers vector.

At this time, in the inclined interface expanding layer 32, a first c-plane growth region 60 that grows using the c-plane 30*c* as a growth plane and an inclined interface growth region 70 (gray part in the figure) that grows using the inclined interface 30*i* other than the c-plane as a growth plane, are formed based on a difference in a growth plane during a growth process.

Also, at this time, in the first c-plane growth region 60, a concave portion 60*a* is formed at a position where the inclined interface 30*i* is generated, and a convex portion 60*b* is formed at a position where the c-plane 30*c* disappears. Further, in the first c-plane growth region 60, a pair of inclined portions 60*i* are formed on both sides of the convex portion 60*b* as a locus of an intersection of the c-plane 30*c* and the inclined interface 30*i*.

(S240: Inclined Interface Maintenance Step)

Figure 3A:
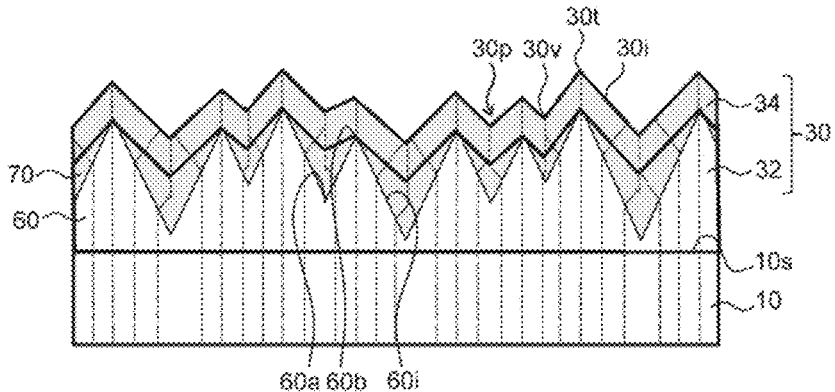
FIG. 3A is a schematic cross-sectional view showing a part of the method for manufacturing a gallium nitride single crystal substrate according to an embodiment of the present invention.

After the c-plane 30*c* disappears from the surface of the inclined interface expanding layer 32, as shown in FIG. 3A, the growth of the first layer 30 is continued to a predetermined thickness while maintaining a state in which the surface is composed only of the inclined interface 30*i*. Thereby, the inclined interface maintaining layer 34 having no c-plane and having only the inclined interface 30*i* on the surface, is formed on the inclined interface expanding layer 32. By forming the inclined interface maintaining layer 34, the c-plane 30*c* can reliably disappear over an entire surface of the first layer 30.

At this time, the growth condition in the inclined interface maintenance step S240 is maintained as the above-described first growth condition, similarly to the inclined interface expansion step S220. Thereby, the inclined interface maintaining layer 34 can grow using only the inclined interface 30*i* as a growth plane.

Further, at this time, when the inclined interface maintaining layer 34 grows using the inclined interface 30*i* as a growth plane under the first growth condition, as described above, the dislocations that have propagated by bending in the direction oblique to the c-axis at a position where the inclined interface 30*i* is exposed in the inclined interface expanding layer 32, continue to propagate in the same direction in the inclined interface maintenance layer 34 as well Further, at this time, when the inclined interface maintaining layer 34 grows using the inclined interface 30*i* as a growth plane, an entire inclined interface maintaining layer 34 becomes a part of the inclined interface growth region 70.

The inclined interface growth region 70 can more easily incorporate oxygen than the first c-plane growth region 60. Therefore, the oxygen concentration in the inclined interface growth region 70 is higher than the oxygen concentration in the first c-plane growth region 60. The oxygen incorporated into the inclined interface growth region 70 is, for example, oxygen that is unintentionally mixed into the HVPE device, or oxygen that is released from a member (such as a quartz member) that constitutes the HVPE device. Due to incorporation of oxygen into the inclined interface growth region 70, a lattice constant increases and a crystal deforms to a convex side. The c-plane shape of a GaN substrate manufactured by the VAS method is generally concavely curved. When the GaN substrate manufactured by the VAS method is used as the base substrate 10, the c-plane shape, which was initially concave, gradually deforms to the convex side as the inclined interface growth region 70 grows thicker, and approaches a flat surface, resulting in making a small c-axis distribution. Thereby, the radius of curvature of the c-plane 40*c* of a main growth layer 44, which will be described later, can be increased.

The oxygen concentration in the first c-plane growth region 60 is, for example, $5 \times 10^{16}$ cm$^{-3}$ or less, preferably $3 \times 10^{16}$ cm$^{-3}$ or less. On the other hand, the oxygen concentration in the inclined interface growth region 70 is, for example, $3 \times 10^{18}$ cm$^{-3}$ or more and $5 \times 10^{19}$ cm$^{-3}$ or less.

Here, by doping the inclined interface growth region 70 with Ge at a high concentration, dislocations that have accumulated large strains can be reduced on the surface of the second layer 40, which will be described later. Ge has an effect of hindering a movement of dislocations (pinning effect, pinning), and also has a property that the larger the dislocation strain field, the easier it is to collect impurities at the dislocation core due to the Cottrell effect. As described above, the dislocations exist in the concave portions 30*p*, so that the dislocations gathers and associate with each other to form a large Burgers vector. By doping the inclined interface 30*i* (especially the inclined interface growth region 70) with Ge at a high concentration, among the dislocations that gather, those with particularly large strain fields are pinned by Ge. The pinned dislocations are prevented from progressing to other slip planes, making it difficult to maintain propagation in the same form, and in order to maintain propagation, the pinned dislocations have an increased probability of decomposing into two or more dislocations to continue progressing. Since each decomposed dislocation becomes a dislocation with a smaller strain field than before, it is possible to increase the abundance ratio of dislocations with a small strain field on the surface of the second layer 40. By decomposing the dislocations with large strain fields, the number of dislocations increases, but since an absolute number of dislocations with large strain fields is originally small, the number of dislocations that increase due to the above decomposition is so small that it can be ignored compared to the number of dislocations that is reduced due to gathering approximately at the center of the concave portions 30*p* of the inclined interface 30*i*. This makes it possible to selectively reduce the dislocations with large strain fields that adversely affect the device characteristics.

Like oxygen, Ge is also easily incorporated into the inclined interface growth region 70 that grows using the inclined interface 30*i* other than the c-plane as a growth plane, compared to the first c-plane growth region 60 that grows using the c-plane 30*c* as the growth plane. Therefore, when Ge doping is started at the timing when the inclined interface 30*i* is formed, the Ge concentration of the inclined interface 30*i* becomes higher than that of the c-plane 30*c*. Further, in the inclined interface 30*i*, the dislocations are bent in the direction oblique to the c-axis and gather approximately at the center of the concave portions 30*p*. Therefore, by doping Ge at a timing when the inclined interface 30*i* is formed, the dislocations with large strain fields can be effectively reduced.

The Ge concentration of the inclined interface growth region 70 is preferably $3 \times 10^{18}$ to $9 \times 10^{20}$ cm$^{-1}$. The O concentration and Ge concentration in the inclined interface growth region 70 can be measured by, for example, secondary ion mass spectrometry (SIMS). The effect of increasing the abundance ratio of dislocations with a small strain field begins to become noticeable when the Ge concentration of the inclined interface growth region 70 exceeds $5 \times 10^{18}$ cm$^{-3}$ and reaches a local maximum near $5 \times 10^{19}$ cm$^{-3}$. When the Ge concentration in the inclined interface growth region 70 exceeds $5 \times 10^{21}$ cm$^{-3}$, the crystal will grow abnormally (for example, become polycrystalline).

Through the above first step S200, the first layer 30 having the inclined interface expanding layer 32 and the inclined interface maintaining layer 34 is formed.

In the first step S200 of this embodiment, it is preferable that the height from the main surface 10s of the base substrate 10 to the top 30t of the first layer 30 (a maximum height in a thickness direction of the first layer 30, hereinafter also referred to as the thickness of the first layer 30) is, for example, 0.5 mm or more and 3 mm or less. When the thickness of the first layer 30 is less than 0.5 mm, there is a possibility that the effect of increasing the abundance ratio of dislocations with a small strain field on the surface of the second layer 40 may not be sufficiently obtained. In contrast, by setting the thickness of the first layer 30 to 0.5 mm or more, it is possible to sufficiently obtain the effect of increasing the abundance ratio of dislocations with a small strain field. On the other hand, when the thickness of the first layer 30 exceeds 3 mm, there is a high possibility that the effect of increasing the abundance ratio of dislocations with a small strain field on the surface of the second layer 40 will be saturate, and there will be a disadvantage in terms of a production cost. Meanwhile, by setting the thickness of the first layer 30 to 3 mm or less, it is possible to efficiently obtain the effect of increasing the abundance ratio of dislocations with a small strain field.

(S300: Second Step (Second Layer Growth Step))

Figure 3B:
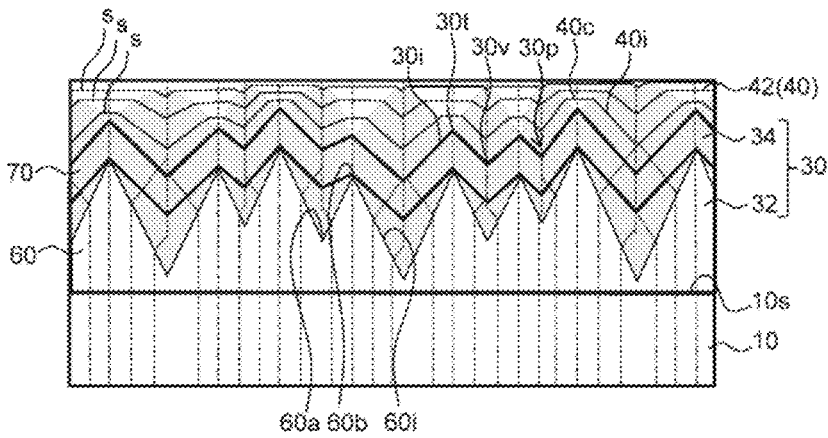
FIG. 3B is a schematic cross-sectional view showing a part of the method for manufacturing a gallium nitride single crystal substrate according to an embodiment of the present invention.
Figure 4A:
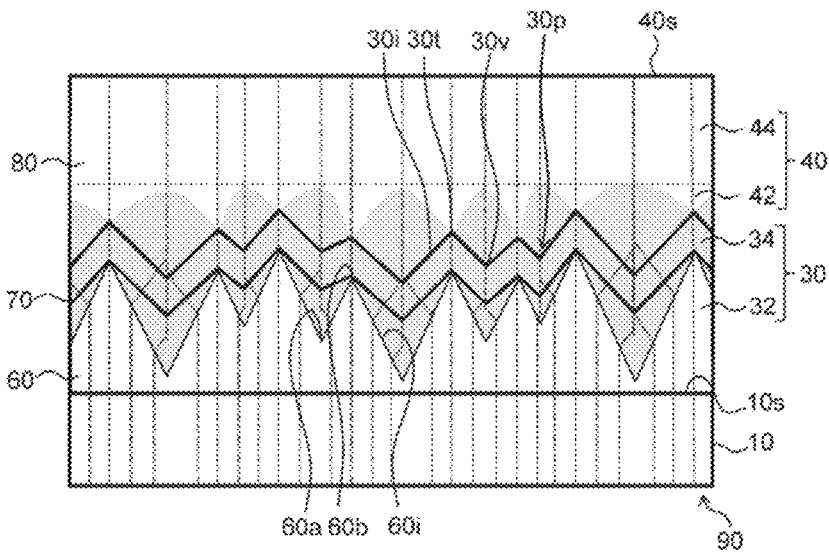
FIG. 4A is a schematic cross-sectional view showing a part of the method for manufacturing a gallium nitride single crystal substrate according to an embodiment of the present invention.

After growth of the first layer 30 in which the c-plane 30c disappears, as shown in FIGS. 3B and 4A, a GaN single crystal is further epitaxially grown on the first layer 30.

At this time, the inclined interface 40i is gradually reduced and the c-plane 40c is gradually expanded upward of the main surface 10s of the base substrate 10. This causes the inclined interface 30i formed on the surface of the first layer 30 to disappear. As a result, the second layer 40 with a mirror-finished surface grows.

In the second step S300, for example, the second layer 40 is grown under a predetermined second growth condition. As the second growth condition of this embodiment, the growth temperature in the second step S300 is set higher than the growth temperature in the first step S200, for example. Specifically, the growth temperature in the second step S300 is set to, for example, 990° C. or more and 1,120° C. or less, preferably 1,020° C. or more and 1,100° C. or less.

Further, as the second growth condition of this embodiment, the V/III ratio in the second step S300 may be adjusted. For example, the V/III ratio in the second step S300 may be smaller than the V/III ratio in the first step S200. Specifically, the V/III ratio in the second step S300 is, for example, 1 or more and 10 or less, preferably 1 or more and 5 or less.

The second step S300 of this embodiment is classified into two steps based on, for example, the form of the second layer 40 during growth. Specifically, the second step S300 of this embodiment includes, for example, a c-plane expansion step S320 and a main growth step S340. Through these steps, the second layer 40 includes, for example, the c-plane expanding layer 42 and the main growth layer 44.

Other conditions among the second growth condition of this embodiment are as follows, for example.

Growth pressure: 90 to 105 kPa, preferably 90 to 95 kPa
Partial pressure of GaCl gas: 1.5-15 kPa
$N_2$ gas flow rate/$H_2$ gas flow rate: 1 to 20

(S320: C-Plane Expansion Step)

As shown in FIG. 3B, the c-plane expanding layer 42 of the second layer 40 comprising single crystal GaN is epitaxially grown on the first layer 30 under the second growth condition described above.

At this time, the inclined interface 40i other than the c-plane is reduced while expanding the c-plane 40c upward of the first layer 30.

Specifically, with a growth under the second growth condition, the c-plane expanding layer 42 grows from the inclined interface 30i of the inclined interface maintaining layer 34 in a direction perpendicular to the c-axis (i.e., in a creeping direction or laterally). As the c-plane expanding layer 42 grows laterally, the c-plane 40c of the c-plane expanding layer 42 begins to be exposed again on the upper side of the top 30t of the inclined interface maintenance layer 34. Thereby, the c-plane expanding layer 42 is formed, in which the c-plane 40c and the inclined interface 40i other than the c-plane coexist on the surface.

When the c-plane expanding layer 42 further grows laterally, the c-plane 40c gradually expands, and the inclined interface 40i of the c-plane expanding layer 42 is gradually reduced. Thereby, the concave portions 30p formed by the multiple inclined interfaces 30i on the surface of the first layer 30, is gradually buried.

Thereafter, with further growth of the c-plane expanding layer 42, the inclined interface 40i of the c-plane expanding layer 42 completely disappears, and the concave portion 30p formed by multiple inclined interfaces 30i on the surface of the first layer 30 is completely buried. This causes the surface of the c-plane expanding layer 42 to be a mirror-finished surface (flat surface) composed only of the c-plane 40c.

At this time, due to the local gathering of dislocations during the growth process of the first layer 30 and the c-plane expanding layer 42, the dislocation density can be reduced. Specifically, the dislocations that have propagated in the first layer 30 by bending in the direction oblique to the c-axis continue to propagate in the same direction in the c-plane expanding layer 42 as well. This causes the dislocations to locally gather in the c-plane expanding layer 42 at a meeting part of the adjacent inclined interfaces 40i on the upper side at approximately the center between the pair of top portions 30t. Among the multiple dislocations that gather at the meeting part of the adjacent inclined interfaces 40i in the c-plane expanding layer 42, dislocations having mutually opposing Burgers vectors disappear when they associate with each other. Further, some of the multiple dislocations that gather at the meeting part of the adjacent inclined interfaces 40i form loops, and are suppressed from propagating in the direction along the c-axis (that is, the surface side of the c-plane expanding layer 42). Some other multiple dislocations that gather at the meeting part of the adjacent inclined interfaces 40i in the c-plane expanding layer 42 change their propagation direction again from a direction inclined with respect to the c-axis to a direction along the c-axis, and propagate to the surface side of the second layer 40. In this way, due to disappearance of some of the plurality of dislocations or suppressing some of the multiple dislocations from propagating to the surface side of the c-plane expanding layer 42, the dislocation density on the surface of the second layer 40 can be reduced. Further, due to the local gathering of the dislocations, a low dislocation density region can be formed on the upper side of the portion of the second layer 40 where the dislocations have propagated in the direction oblique to the c-axis.

Here, also in the c-plane expansion step S320, it is preferable to dope the second layer 40 (particularly the c-plane expanding layer 42) with Ge at a high concentration. By doping the c-plane expanding layer 42 with Ge at a high concentration while the inclined interface 40i grows similarly to the inclined interface growth region 70, it is possible to suppress the increase in dislocations that have accumulated large strains in the c-plane 40c of the second layer 40. Further, by doping with Ge at a high concentration while the inclined interface 40i grows, the dislocations that have accumulated large strains can be further reduced. When doping the c-plane expanding layer 42 with Ge, doping with Ge may be performed at the same concentration as doping the inclined interface growth region 70 with Ge, or doping at a different concentration may be acceptable. When doping at a different concentration from that of the inclined interface growth region 70, it is preferable to continuously change the Ge concentration during the growth of the second layer 40. At this time, the partial pressure of GeCl₄ gas is preferably adjusted within a range of 0.3 to 40 Pa.

Further, at this time, in the c-plane expanding layer 42, due to the gradual expansion of the c-plane 40c, a later-described second c-plane growth region 80, which grows using the c-plane 40c as a growth plane, is formed while gradually expanding upward in the thickness direction.

In the c-plane expansion step S320, due to the surface of the c-plane expanding layer 42 being a mirror-finished surface composed only of the c-plane 40c, the height in the thickness direction (maximum height in the thickness direction) of the c-plane expanding layer 42 is, for example, greater than or equal to the height from the valley 30v to the top 30t of the inclined interface maintaining layer 34.
(S340: Main Growth Step (c-Plane Growth Step))

When the inclined interface 40i disappears in the c-plane expanding layer 42 and the surface becomes mirror-finished, as shown in FIG. 4A, a main growth layer 44 is formed on the c-plane expanding layer 42 to be a predetermined thickness using the c-plane 40c as a growth plane. Thereby, the main growth layer 44 is formed, which does not have the inclined interface 40i and has only the c-plane 40c on its surface.

At this time, the growth condition in the main growth step S340 is maintained as the above-described second growth condition similarly to the c-plane expansion step S320. Thereby, the main growth layer 44 is grown in a step-flow manner using the c-plane 40c as a growth plane.

In the main growth step S340, a silicon (Si)-doped GaN layer may be epitaxially grown as the second layer 40 by supplying GaCl gas, NH₃ gas, and dichlorosilane (SiH₂Cl₂) gas as an n-type dopant gas, or Ge-doped GaN layer may be epitaxially grown by supplying GeCl₄ gas instead of SiH₂Cl₂ gas as an n-type dopant gas, to the base substrate 10 heated to a predetermined growth temperature. As the second layer 40, a GaN layer doped with iron (Fe), manganese (Mn), carbon (C), etc., may be epitaxially grown.

In the main growth step S340, when doping the second layer 40 with Ge, doping with Ge may be performed at the same concentration as doping the c-plane expanding layer 42 with Ge, or doping at a different concentration may be acceptable in the c-plane enlargement step S320. When doping at a different concentration from that in the c-plane expansion step S320, it is preferable to continuously change the Ge concentration during growth in the main growth step S340. At this time, the partial pressure of GeCl₄ gas is preferably adjusted within a range of 0.3 to 50 Pa. Further, when doping with a dopant other than Ge (for example, Si) in the main growth step S340, during the growth in the main growth step S340, it is preferable that the Ge concentration is gradually reduced, and after the Ge concentration reaches about a lower limit of detection by SIMS, the concentration of a dopant other than Ge is gradually increased.

Further at this time, due to incorporation of oxygen into the inclined interface growth region 70, the crystal lattice is extended, and due to the small c-axis distribution of the second layer 40, the radius of curvature of the c-plane 40c of the main growth layer 44 that grows on the second layer 40 can be larger than the radius of curvature of the c-plane 10c of the base substrate 10. Thereby, a variation in the off-angle of the c-axis with respect to a normal on the main growth layer 44 can be smaller than a variation in the off-angle of the c-axis 10ca with respect to the normal on the main surface 10s of the base substrate 10.

Further at this time, due to the growth of the main growth layer 44 using only the c-plane 40c as a growth plane without exposing the inclined interface 40i, an entire main growth layer 44 becomes a second c-plane growth region 80, which will be described later.

In the main growth step S340, the thickness of the main growth layer 44 is set to, for example, 300 μm or more and 10 mm or less. By setting the thickness of the main growth layer 44 to 300 μm or more, at least one or more substrates 50 can be sliced from the main growth layer 44 in a slicing step S400, which will be described later. On the other hand, by setting the thickness of the main growth layer 44 to 10 mm or less, at least 10 substrates 50 can be obtained even in consideration of a carf loss of about 200 μm, when a 700 μm thick substrate 50 is sliced from the main growth layer 44, with a final thickness set as 650 μm.

Through the above second step S300, the second layer 40 including the c-plane expanding layer 42 and the main growth layer 44 is formed. As a result, the multilayered structure 90 of this embodiment is formed.

The above steps from the first step S200 to the second step S300 are performed continuously in the same chamber without exposing the base substrate 10 to the atmosphere. Thereby, it is possible to suppress the formation of an unintended high oxygen concentration region (a region having an excessively higher oxygen concentration than the inclined interface growth region 70) at the interface between the first layer 30 and the second layer 40.
(S400: Slicing Step)

Figure 4B:
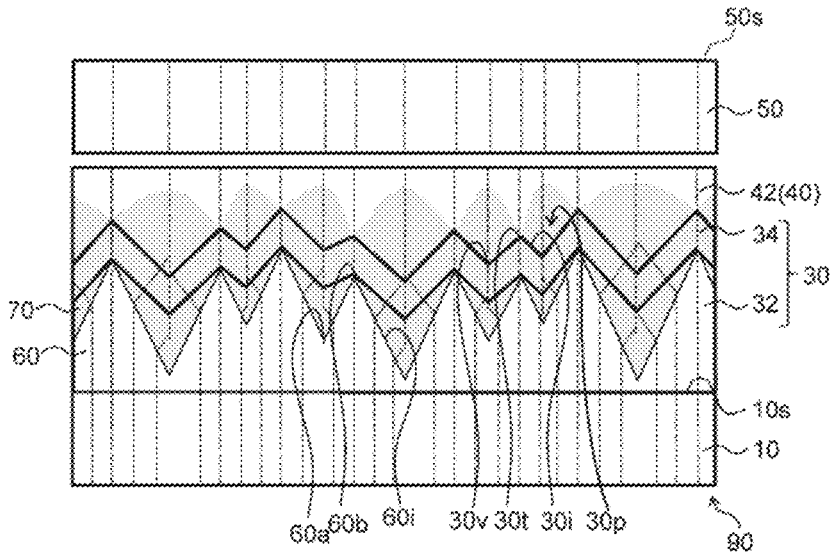
FIG. 4B is a schematic cross-sectional view showing a part of the method for manufacturing a gallium nitride single crystal substrate according to an embodiment of the present invention.

Next, as shown in FIG. 4B, the main growth layer 44 is sliced, for example, along a cutting plane substantially parallel to the surface of the main growth layer 44 using a wire saw. Thereby, at least one gallium nitride single crystal substrate 50 (also referred to as a substrate 50) as an as-sliced substrate is formed. At this time, the thickness of the substrate 50 is, for example, 300 μm or more and 700 μm or less.

At this time, the radius of curvature of the c-plane 50c of the substrate 50 cut out from the main growth layer 44 is larger than the radius of curvature of the c-plane 10c of the base substrate 10, for the above-described reason. Thereby, the variation in the off-angle θ of the c-axis 50ca with respect to the normal on the main surface 50s of the substrate 50 can be smaller than the variation in the off-angle of the c-axis 10ca of the base substrate 10.
(S500: Polishing Step)

Next, both sides of the substrate 50 are polished using a polishing device. At this time, a final thickness of the substrate 50 is, for example, 250 μm or more and 650 μm or less.

Through the above steps, the substrate 50 according to this embodiment is manufactured.
(Fabricating Step of a Semiconductor Laminate and Fabricating Step of a Semiconductor Device)

When the substrate 50 is manufactured, for example, a semiconductor functional layer comprising a group III nitride semiconductor may be epitaxially grown on the substrate 50 so that a semiconductor laminate is fabricated.

After the semiconductor laminate is fabricated, electrodes, etc., are further formed on the semiconductor laminate, and the semiconductor laminate is diced into cut out chips of a predetermined size. In this way, a semiconductor device may be fabricated. By reducing the dislocations that have accumulated large strains on the surface of the substrate 50, the characteristics of the semiconductor device fabricated on the substrate 50 can be improved.

(2) Gallium Nitride Single Crystal Substrate (Nitride Semiconductor Free-Standing Substrate, Nitride Crystal Substrate)

Next, the gallium nitride single crystal substrate 50 according to this embodiment will be described.

In this embodiment, the substrate 50 obtained by the above-described manufacturing method is a free-standing substrate comprising a GaN single crystal.

The diameter of the substrate 50 is, for example, 50 mm or more. Further, the thickness of the substrate 50 is, for example, 300 m or more and 1 mm or less.

Although the conductivity of the substrate 50 is not particularly limited, when manufacturing a semiconductor device as a vertical Schottky barrier diode (SBD) using the substrate 50, the substrate 50 is, for example, an n-type, and the n-type impurity in the substrate 50 is, for example, Si or germanium (Ge), and the n-type impurity concentration in the substrate 50 is, for example, $1.0 \times 10^{18}$ cm$^{-3}$ or more and $1.0 \times 10^{20}$ cm$^{-3}$ or less.

The substrate 50 has, for example, a main surface 50s that serves as an epitaxial growth plane. In this embodiment, a low-index crystal plane closest to the main surface 50s is, for example, the c-plane 50c.

The main surface 50s of the substrate 50 is, for example, mirror-finished, and the root mean square roughness RMS of the main surface 50s of the substrate 50 is, for example, less than 1 nm.

Further, in this embodiment, the impurity concentration in the substrate 50 obtained by the above-described manufacturing method is lower than that of a substrate obtained by a flux method, an ammonothermal method, etc.

Specifically, the hydrogen concentration in the substrate 50 is, for example, less than $1 \times 10^{17}$ cm$^{-3}$, preferably $5 \times 10^{16}$ cm$^{-3}$ or less.

Further, in this embodiment, the substrate 50 is formed by slicing the main growth layer 44 that grows using the c-plane 40c as a growth plane, thus not including the inclined interface growth region 70 that grows using the sloped interface 30i or the inclined interface 40i as a growth plane. That is, an entire substrate 50 is constituted by a low oxygen concentration region.

Specifically, the oxygen concentration in the substrate 50 is, for example, $5 \times 10^{16}$ cm$^{-3}$ or less, preferably $3 \times 10^{16}$ cm$^{-3}$ or less.

(Curvature of the c-Plane and Variation of Off-Angle)

In this embodiment, the radius of curvature of the c-plane 50c of the substrate 50 is, for example, larger than the radius of curvature of the c-plane 10c of the base substrate 10 used in the method for manufacturing the substrate 50 described above.

Specifically, the radius of curvature of the c-plane 50c of the substrate 50 is, for example, 23 m or more, preferably 30 m or more, and more preferably 40 m or more.

In this embodiment, an upper limit of the radius of curvature of the c-plane 50c of the substrate 50 is not particularly limited, because the larger the better. When the c-plane 50c of the substrate 50 is substantially flat, it may be considered that the radius of curvature of the c-plane 50c is infinite.

Further, in this embodiment, since the radius of curvature of the c-plane 50c of the substrate 50 is large, the variation in the off-angle θ of the c-axis 50ca with respect to the normal on the main surface 50s of the substrate 50 can be smaller than the variation in the off-angle θ of the c-axis 10ca of the base substrate 10.

Specifically, when performing X-ray rocking curve measurement of the (0002) plane of the substrate 50 and measuring the off angle θ of the c-axis 50ca with respect to the normal on the main surface 50s based on the diffraction peak angle of the (0002) plane, the variation determined by the maximum and minimum difference in the size of the off angle θ within a diameter of 29.6 mm from the center of the main surface 50s is, for example, 0.0750 or less, preferably 0.057° or less, and more preferably 0.043° or less.

In this embodiment, the lower limit of the variation in the off-angle θ of the c-axis 50ca of the substrate 50 is not particularly limited, because the smaller the better. When the c-plane 50c of the substrate 50 is substantially flat, it may be considered that the variation in the off-angle θ of the c-axis 50ca of the substrate 50 is 0°.

Further, in this embodiment, since the curvature of the c-plane 50c is isotropically reduced with respect to the main surface 50s of the substrate 50, the radius of curvature of the c-plane 50c has little directional dependence.

Specifically, the difference between the radius of curvature of the c-plane 50c in the direction along the a-axis and the radius of curvature of the c-plane 50c in the direction along the m-axis, which is determined by the above measurement method is, for example, 50% or less, preferably 20% or less of the larger radius of curvature.

(Dislocation Density)

In this embodiment, by the above-described manufacturing method, the dislocation density in the surface of the second layer 40 is lower than the dislocation density in the main surface 10s of the base substrate 10. Thereby, dislocations are also reduced in the main surface 50s of the substrate 50 formed by slicing the second layer 40.

When the substrate 50 is manufactured using the base substrate 10 comprising a high-purity GaN single crystal and fabricated by the VAS method, there are fewer non-emissive centers in the substrate 50 due to a foreign matter or a point defect.

Accordingly, 95% or more (preferably 99% or more) of dark spots observed when observing the main surface of the substrate 50 of the present application using a multiphoton excitation microscope, etc., correspond to dislocations rather than non-emissive centers caused by the foreign matter or the point defect. A "multiphoton excitation microscope" is also sometimes called a two-photon excitation fluorescence microscope.

In this embodiment, regions with particularly high dislocation density due to concentration of dislocations are not formed, and regions with low dislocation density are uniformly formed.

Specifically, in this embodiment, when the main surface 50s of the substrate 50 is observed with a field of view of 250 μm square using a multiphoton excitation microscope and the dislocation density is obtained from a dark spot density, there is no regions where the dislocation density exceeds $1 \times 10^6$ cm$^{-2}$, and regions having a dislocation density of less than $5 \times 10^5$ cm$^{-2}$ exist in 80% or more, preferably 90% or more, more preferably 95% or more of the main surface 50s.

In other words, in this embodiment, an average dislocation density over an entire main surface 50s of the substrate 50 is, for example, less than $1 \times 10^6$ cm$^{-2}$, preferably less than $5.5 \times 10^5$ cm$^{-2}$, and more preferably $3 \times 10^5$ cm$^{-2}$ or less.

(Etch Pit Histogram)

Figure 5:
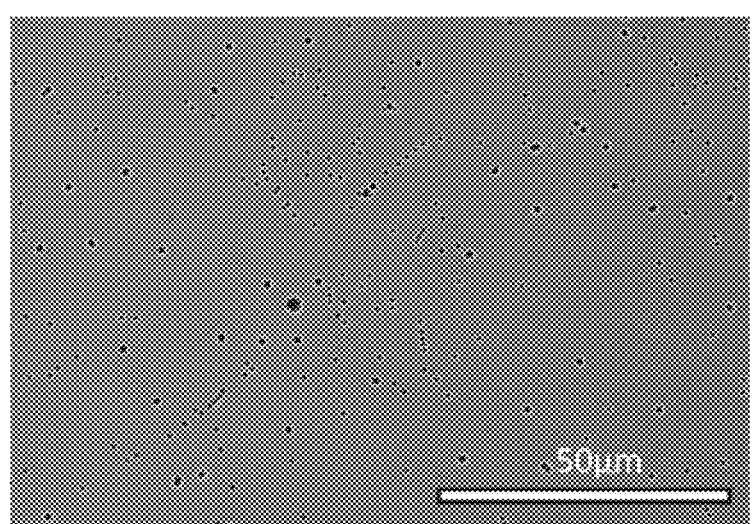
FIG. 5 is a SEM image showing an example of etch pits formed on the main surface of the gallium nitride single crystal substrate according to an embodiment of the present invention.

When the main surface 50s of the substrate 50 is etched using an alkaline etching solution, etch pits as shown in FIG. 5 are formed. In this embodiment, the substrate 50 was immersed for 20 minutes in a melt (temperature: 470° C.) made by mixing potassium hydroxide (KOH) and sodium hydroxide (NaOH) at a ratio of 1:1 to perform etching. Then, the main surface 50s of the substrate 50 after etching was observed using the SEM, and the diameter of each etch pit was calculated by image analysis, and a histogram of etch pit diameters was created from the obtained etch pit diameter data. The etch pit diameter may be a maximum diameter of each etch pit region subjected to image analysis, or may be an equivalent circle diameter. In this embodiment, among the peaks appearing in the histogram of the etch pit diameters, the diameter of the peak (hereinafter also referred to as a first peak) appearing on a smallest diameter side is normalized as a. The class (step width) on the horizontal axis was set in steps of 0.1a. The vertical axis represents the number (frequency) of the etch pits within a measurement area.

The density of the etch pits (number per unit area) formed when etching is applied to the main surface 50s of the substrate 50 of this embodiment under the above conditions, approximately corresponds to a dislocation density. The size of the etch pit can be changed depending on the etching conditions, but when they are present at too high a density, adjacent etch pits will overlap, making it difficult to measure the diameter of the etch pits. Therefore, in order to perform a meaningful measurement, the density of the etch pits is preferably less than $1 \times 10^6$ cm$^{-2}$, more preferably less than $5.5 \times 10^5$ cm$^{-2}$, and even more preferably $3 \times 10^5$ cm$^2$ or less. The histogram of the etch pit density and the etch pit diameter is preferably measured from a region having an area of 1 mm$^2$ or more.

In the substrate 50 of this embodiment, when the diameter of the first peak is a, the total number (sum) of etch pits with a diameter exceeding 4a is $\frac{1}{1000}$ or less of the number of etch pits forming the first peak. This can be said to mean that there are substantially no etch pits with diameters exceeding 4a, but the total number of etch pits is expressed as $\frac{1}{1000}$ or less because large etch pits may be formed due to a scratch or a foreign matter on the substrate 50. It can be said that such a substrate 50 is substantially free of dislocations that accumulate large strains that would deteriorate the device characteristics. Therefore, the characteristics of the device fabricated on the substrate 50 can be improved.

In the substrate 50 of this embodiment, the total number of etch pits with a diameter of 2a or more is preferably $\frac{1}{10}$ or less, more preferably $\frac{1}{100}$ or less of the number of etch pits forming the first peak. Etch pits with a diameter of 2a or more may correspond to the dislocations that affect the device characteristics of the substrate 50. Therefore, by setting the total number of etch pits with a diameter of 2a or more to $\frac{1}{10}$ or less (more preferably $\frac{1}{100}$ or less) of the number of etch pits forming the first peak, the characteristics of the device fabricated on the substrate 50 can be further improved.

In the substrate 50 of this embodiment, the number of etch pits forming the first peak is preferably 50% or more (more preferably 70% or more) of the total. As described above, in the first step S200, by doping the inclined interface growth region 70 with Ge at a high concentration, the abundance ratio of dislocations with a small strain field is increased. Therefore, the number of etch pits forming the first peak can be increased. Dislocations with a small strain field do not have a large effect on the device characteristics of the substrate 50. Therefore, a high proportion of the etch pits forming the first peak means that the characteristics of the device fabricated on the substrate 50 are excellent.

In the substrate 50 of this embodiment, when the frequency of the first peak is A, it is preferable that the number of peaks with a frequency of A/10 or more appearing in the diameter histogram is two, including the first peak. It can be said that the number of peaks appearing in the histogram of etch pits corresponds to the number of constituent species of dislocation defects corresponding to the etch pits. It can be said that the crystal with many peaks observed is a crystal that has many variations not only in dislocations such as simple edge-shaped and mixed dislocations, but also in impurities and point defects that are complexly connected to these dislocations, which is a crystal that is likely to have many impurity levels and defect levels, and a crystal that has a large variation in characteristics when fabricating the device, in other words, possibly with poor device yield. In contrast, the crystal with two peaks of A/10 or higher frequency, including the first peak, appearing in the histogram, suggests that there are only two types of dislocations in the crystal: simple edge-shaped dislocations and mixed dislocations, that is, it can be said that this is a crystal with a small variation in characteristics, and a high device yield when fabricating the device.

Further, it is preferable that the substrate 50 of this embodiment has a second peak in a diameter range of more than a and less than 2a, and it is preferable that the number of etch pits forming the second peak is smaller than the number of etch pits forming the first peak. The fact that the diameter of the etch pit forming the second peak is in a range of more than a and less than 2a, means that it is highly likely that the etch pit corresponds to a simple mixed dislocation. The fact that the number of etch pits forming the second peak is small, in other words, the number of etch pits forming the first peak is large, means that dislocations in the crystal are mainly composed of less strained dislocations around the dislocation core. These characteristics mean that the device fabricated on the substrate 50 has excellent characteristics.

Other Embodiments

The embodiments of the present invention have been specifically described above. However, the present invention is not limited to the above-described embodiments, and various changes can be made without departing from the spirit thereof.

In the above-described embodiment, explanation is given for the case where the base substrate 10 is a commercially available gallium nitride single crystal substrate or a GaN free-standing substrate fabricated by the VAS method. However, the base substrate 10 is not limited to the GaN free-standing substrate fabricated by the VAS method, and may be a GaN free-standing substrate fabricated by another method, for example.

In the above-described embodiment, explanation is given for the case where the substrate 50 is n-type. However, the substrate 50 may be p-type or semi-insulating. For example, when manufacturing a semiconductor device as a high electron mobility transistor (HEMT) using the substrate 50, the substrate 50 preferably has semi-insulating properties.

In the above-described embodiment, explanation is given for the case where the growth temperature is mainly adjusted as the first growth condition in the first step S200. However, the growth condition other than the growth temperature may be adjusted, or the growth temperature and growth conditions other than the growth temperature may be combined and adjusted.

In the above-described embodiment, explanation is given for the case where the growth temperature is mainly adjusted as the second growth condition in the second step S300. However, growth condition other than the growth temperature may be adjusted, or the growth temperature and growth condition other than the growth temperature may be combined and adjusted.

In the above-described embodiment, explanation is given for the case where the growth condition in the inclined interface maintenance step S240 is maintained as the above-described first growth condition, similar to the inclined interface expansion step S220. However, when the growth condition in the inclined interface maintenance step S240 satisfies the first growth condition, the growth condition in the inclined interface maintenance step S240 may be different from the growth condition in the inclined interface expansion step S220.

In the above-described embodiment, explanation is given for the case where the growth condition in the main growth step S340 is maintained as the above-described second growth condition, similar to the c-plane expansion step S320. However, when the growth condition in the main growth step S340 satisfies the second growth condition, the growth condition in the main growth step S340 may be different from the growth condition in the c-plane expansion step S320.

In the above-described embodiment, explanation is given for the case where the main growth layer 44 is sliced using a wire saw in the slicing step S400. However, for example, an outer peripheral blade slicer, an inner peripheral blade slicer, an electric discharge machine, etc., may be used.

In the above-described embodiment, explanation is given for the case where the manufacturing process is finished after manufacturing the substrate 50. However, steps S200 to S500 may be performed again using the substrate 50 as the base substrate 10. Thereby, the substrate 50 with further reduced dislocation density can be obtained. Further, the substrate 50 with further reduced variation in the off-angle θ of the c-axis 50ca can be obtained. Further, the substrate 50 with reduced dislocations that have accumulated even greater strain can be obtained. Further, with the steps S200 to S500 using the substrate 50 as the base substrate 10 as one cycle, the cycle may be repeated multiple times. Thereby, the dislocation density of the substrate 50 can be gradually reduced depending on the number of times the cycle is repeated. Further, depending on the number of times the cycle is repeated, the variation in the off-angle θ of the c-axis 50ca in the substrate 50 can also be gradually reduced. Further, depending on the number of times the cycle is repeated, the substrate 50 with reduced dislocations that have accumulated large strains can be obtained.

Example

Next, examples according to the present invention will be described. These examples are examples of the present invention, and the present invention is not limited by these examples.

(1) Fabrication of a Gallium Nitride Single Crystal Substrate

Gallium nitride single crystal substrates of example 1, example 2, and comparative example were fabricated as follows.

[Fabrication Conditions of the Gallium Nitride Single Crystal Substrate of Example 1](Base Substrate)

Material: GaN

Fabrication method: VAS method

Diameter: 2 inches

Thickness: 400 μm

Low-index crystal plane closest to the main surface: c-plane

No pattern processing such as a mask layer on the main surface.

Root mean square roughness RMS of the main surface: 2 nm

Off angle of the main surface: 0.4° in m direction

FWHM of (10-10) plane diffraction in XRC measurement: 100 arcsec (first layer)

Material: GaN

Growth method: HVPE method

First Growth Condition:

The growth temperature was set to 980° C. or more and 1,020° C. or less, and the V/III ratio was set to 2 or more and 20 or less. Further, the inclined interface growth region was doped with Ge under the following conditions.

Ge doping method: $GeCl_4$ gas

Partial pressure of the $GeCl_4$ gas: 0.35 Pa

Ge concentration in an inclined interface growth region: $5 \times 10^{18}$ cm$^{-3}$ Thickness from the main surface of the base substrate to the surface of the first layer: 1 mm (second layer)

Material: GaN

Growth method: HVPE method

Second Growth Condition:

The growth temperature was set to 1,050° C. or more and 1080° C. or less, and the V/III ratio was set to 2 or more and 5 or less. In the c-plane expansion step S320, Ge doping was not performed, but in the main growth step S340, Ge doping was performed to achieve the following c-plane Ge concentration.

Thickness from the main surface of the base substrate to the surface of the second layer: 2 mm Ge concentration in c-plane: $3 \times 10^{19}$ cm$^{-3}$ When the Ge concentration of each layer changes from the first layer to the second layer, it was so adjusted that Ge doping amount was gradually increased or decreased so that the difference in Ge concentration of each layer is $1 \times 10^{18}$ cm$^{-3}$ or less.

(Slice Condition)

Thickness of the gallium nitride single crystal substrate: 400 μm

Kerfloss: 200 μm

[Fabrication Condition of the Gallium Nitride Single Crystal Substrate of Example 2](Base Substrate)

Same as example 1.

(First Layer) Ge concentration in the inclined interface growth region: $5 \times 10^{19}$ cm$^{-3}$ Other than the above, the same as example 1.

(Second Layer)

In the c-plane expansion step S320, Ge doping was performed so that the Ge concentration of the inclined interface 40i was $5 \times 10^{19}$ cm$^{-3}$.

Other than the above, the same as example 1.

(Slice Condition)

Same as example 1.

[Fabrication Conditions for a Gallium Nitride Single Crystal Substrate of a Comparative Example](Base Substrate)

Same as example 1.

(First Layer)

Same as example 1 except that Ge doping was not performed.

(Second Layer)

Same as example 1.

(Slice Condition)

Same as example 1.

(2) Evaluation of Etch Pit Histogram

The main surfaces of the gallium nitride single crystal substrates of example 1, example 2, and comparative example were etched with an alkaline etching solution under the following conditions to form etch pits.

Etching solution: alkaline melt consisting of 500 g KOH and 500 g NaOH

Melt temperature: 470° C.

Immersion time: 20 minutes

The main surface of the gallium nitride single crystal substrate with etch pits formed thereon was observed using a SEM (SU5000, manufactured by Hitachi High-Tech Corporation). The measurement field of view was 127 $\mu$m×95.3 $\mu$m (1000× magnification), and etch pits were measured by analyzing an image (1143 $\mu$m×1048 $\mu$m) that was a combination of 9 horizontal×11 vertical SEM images (99 in total). Specifically, using image processing software (Image J), the image was binarized, the etch pit region was filled in, and the larger one of the width and height of the etch pit region was calculated as the diameter of the etch pit. When filling in the etch pit region, regions showing small dust and linear pit regions caused by processing scratches were removed.

A histogram of etch pit diameters was created from the obtained etch pit diameter data. In this example, among the peaks appearing in the histogram of the etch pit diameters, the diameter of the peak (first peak) appearing on the smallest diameter-side was normalized as 1, and the class on the horizontal axis was set in increments of 0.1.

Figure 6A:
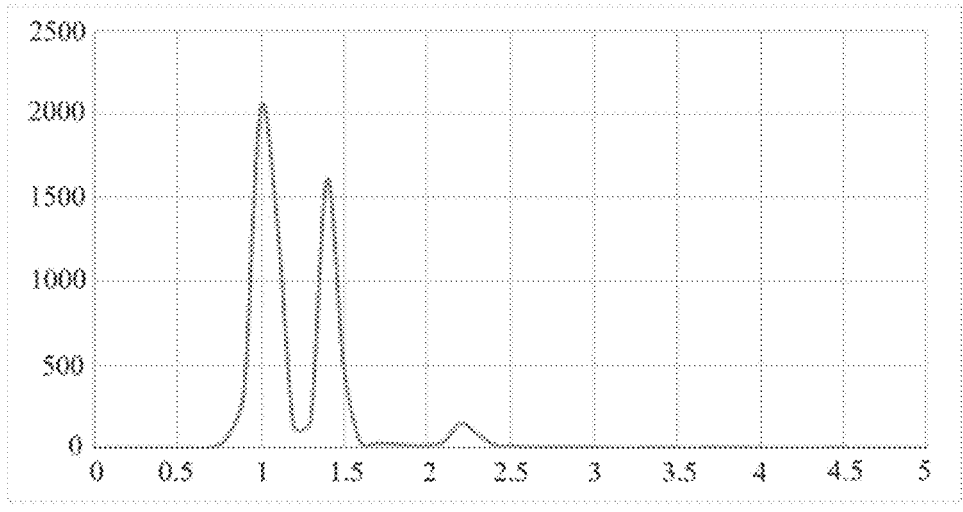
FIG. 6A is a histogram of etch pit diameters according to example 1.
Figure 6B:
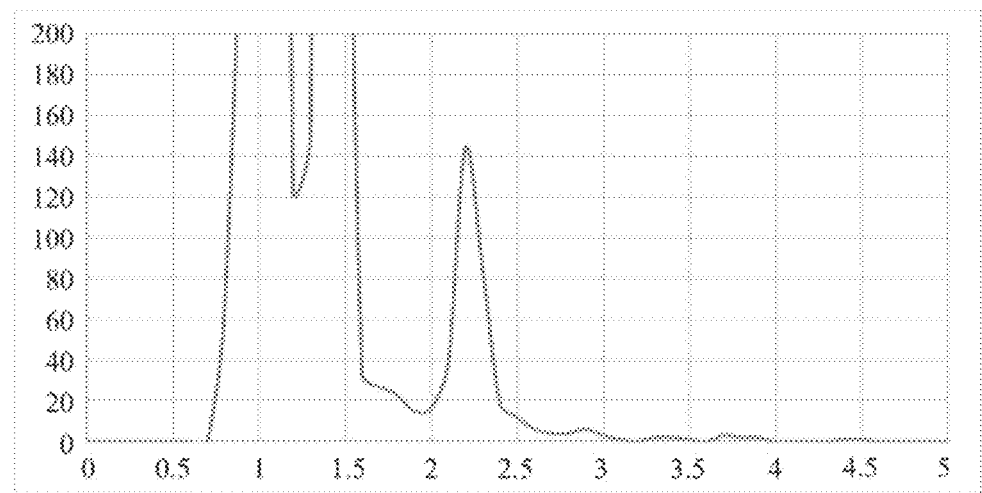
FIG. 6B is an expanded view of FIG. 6A in a vertical axis direction.
Figure 7A:
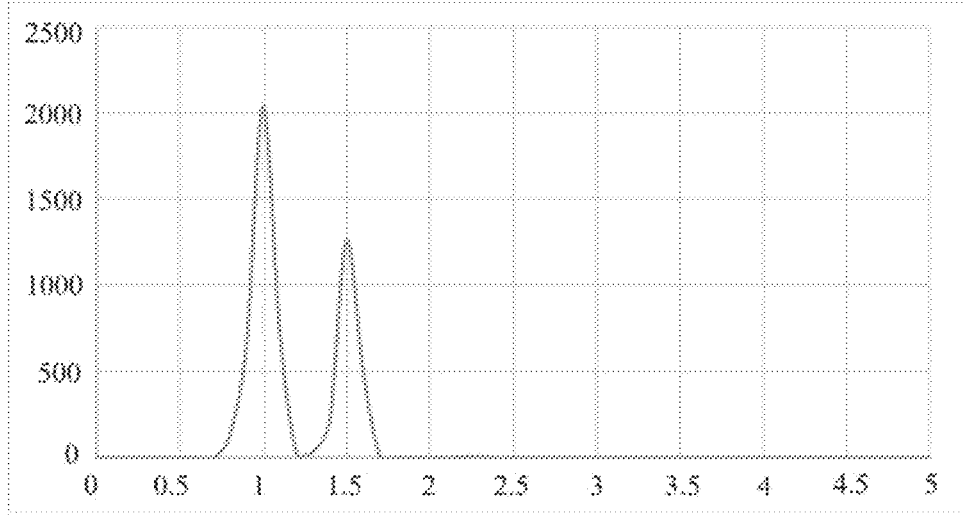
FIG. 7A is a histogram of etch pit diameters according to example 2.
Figure 7B:
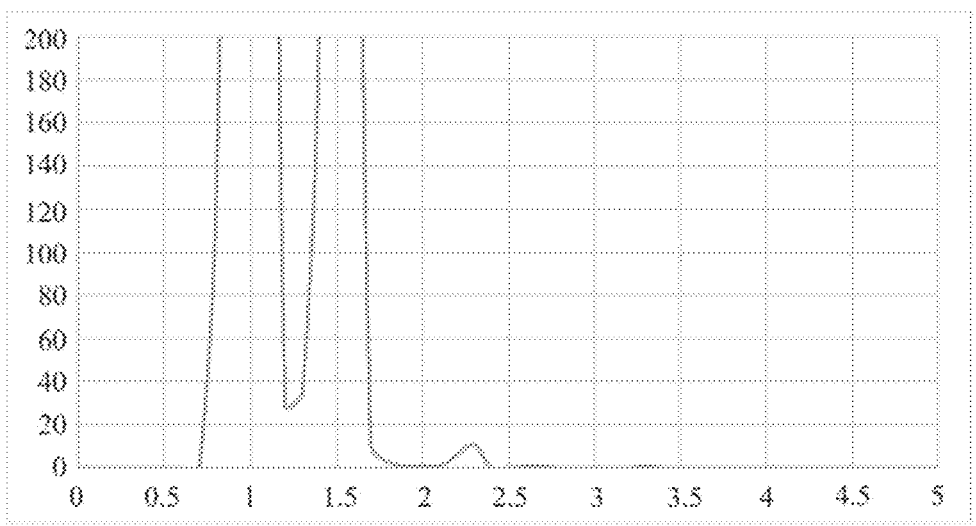
FIG. 7B is an expanded view of FIG. 7A in a vertical axis direction.
Figure 8A:
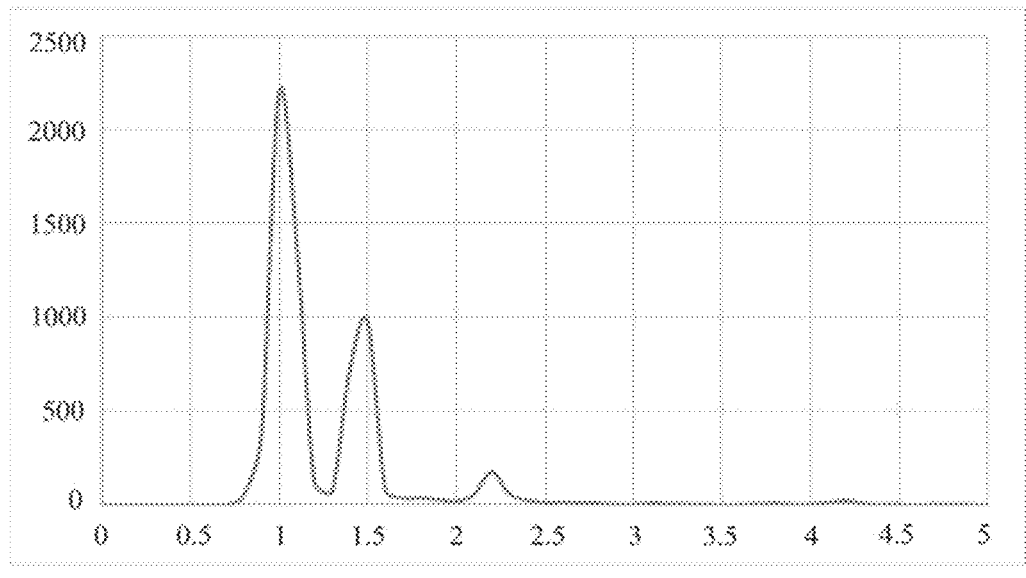
FIG. 8A is a histogram of etch pit diameters according to a comparative example.
Figure 8B:
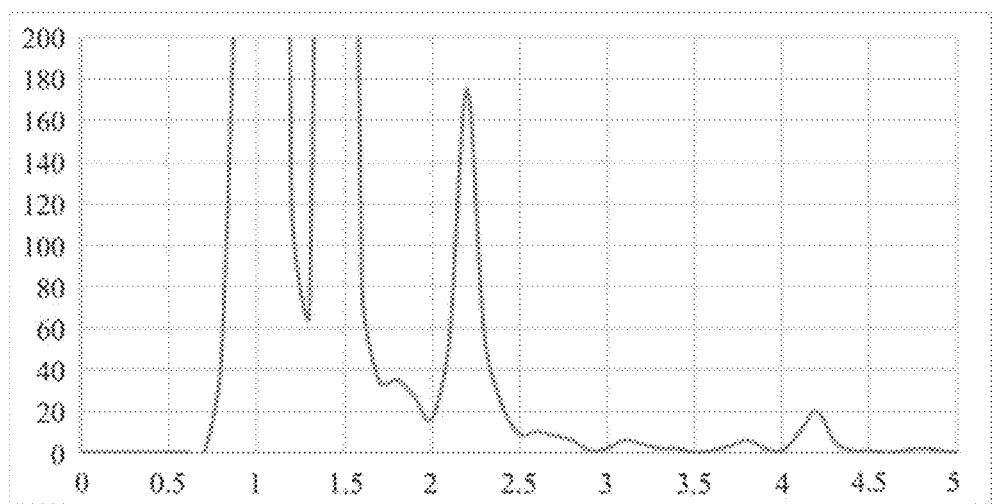
FIG. 8B is an expanded view of FIG. 8A in a vertical axis direction.

FIGS. 6A and 6B show histograms of example 1, FIGS. 7A and 7B show histograms of example 2, and FIGS. 8A and 8B show histograms of comparative example, respectively. In FIG. 6A, FIG. 6B, FIG. 7A, FIG. 7B, FIG. 8A, and FIG. 8B, the horizontal axis shows an etch pit diameter as a reference, and the vertical axis shows the number (frequency) of the etch pits within a measurement area. FIG. 6B, FIG. 7B, and FIG. 8B are the histograms of FIGS. 6A, 7A, and 8A enlarged in a vertical axis (frequency) direction, respectively. Further, table 1 collectively shows the number of etch pits forming the first peak, the number of etch pits with a diameter of less than 2, the number of etch pits with a diameter of 2 or more and less than 4, and the number of etch pits with a diameter of 4 or more, observed in the histograms of example 1, example 2, and comparative example.

TABLE 1

| | First peak | Diameter is less than 2 | Diameter is 2 or more and less than 4 | Diameter is 4 or more |
|---|---|---|---|---|
| Example 1 | 3890 | 6232 | 350 | 2 |
| Example 2 | 3582 | 5602 | 22 | 0 |
| Comparative example | 4192 | 6071 | 386 | 49 |

As shown in FIGS. 8A, 8B and table 1, in the substrate of the comparative example in which the first layer (inclined interface growth region) was not doped with Ge, a few etch pits with diameters exceeding 4 were measured. In contrast, as shown in FIGS. 6A, 6B, 7A, 7B, and table 1, in the substrates of examples 1 and 2 in which the inclined interface growth region was doped with Ge at a high concentration, substantially no etch pits with diameters exceeding 4 were measured (the total number of etch pits with a diameter exceeding 4 was $\frac{1}{1000}$ or less of the number of etch pits forming the first peak).

As described above, it was confirmed that by doping the first layer (inclined interface growth region) with Ge at a high concentration, the total number of etch pits with a diameter exceeding 4a can be reduced (the number can be reduced to $\frac{1}{1000}$ or less of the number of etch pits forming the first peak) when the diameter of the first peak in the histogram of etch pit diameters is a. That is, it can be said that the gallium nitride single crystal substrates of examples 1 and 2 are substantially free of dislocations that have accumulated large strains that would lead to deterioration of the device characteristics. Therefore, the device characteristics can be improved.

Further, as shown in table 1, in the substrate of example 1, the number of etch pits forming the first peak was 3890, and the total number of etch pits with a diameter of 2 or more was 352. That is, in the substrate of example 1, it was confirmed that the total number of etch pits with a diameter of 2 or more was $\frac{1}{10}$ or less of the number of etch pits forming the first peak. In the substrate of example 2, the number of etch pits forming the first peak was 3582, and the total number of etch pits with a diameter of 2 or more was 22. That is, in the substrate of example 2, it was confirmed that the total number of etch pits with a diameter of 2 or more was $\frac{1}{100}$ or less of the number of etch pits forming the first peak. On the other hand, in the substrate of the comparative example, the total number of etch pits forming the first peak was 4192, and the total number of etch pits with a diameter of 2 or more was 435.

Further, in the substrate of example 1, the number of etch pits forming the first peak was 59% of the total, and in the substrate of example 2, the number of etch pits forming the first peak was 64% of the total. That is, in the substrates of examples 1 and 2, it was confirmed that the number of etch pits forming the first peak was 50% or more of the total.

Further, from FIGS. 6A and 7A, it was confirmed that in the substrates of example 1 and example 2, when the frequency of the first peak is A, the number of peaks with a frequency of A/10 or more appearing in the diameter histogram is two, including the first peak.

Further, from FIGS. 6A and 7A, it was confirmed that the substrates of example 1 and example 2 have a second peak in a diameter range of more than 1 and less than 2, and the number of etch pits forming the second peak is smaller than the number of etch pits forming the first peak.

Preferable Aspects of the Present Invention

Hereinafter, preferable aspects of the present invention will be supplementarily described.

Supplementary Description 1

A gallium nitride single crystal substrate, which is a gallium nitride single crystal substrate that has a diameter of 50 mm or more and whose low index crystal plane closest to a main surface is a (0001) plane, wherein a density of etch pits when applying etching to the main surface with an alkaline etching solution is less than 1×10$^6$ cm$^{-2}$, and among peaks appearing in a histogram of diameters of the etch pits, when a diameter of a first peak appearing on a smallest diameter-side is a, a total number of the etch pits with a diameter exceeding 4a is $\frac{1}{1000}$ or less of a number of etch pits forming the first peak.

Supplementary Description 2

The gallium nitride single crystal substrate according to supplementary description 1, wherein a total number of the etch pits with a diameter of 2a or more is $\frac{1}{10}$ or less of a number of etch pits forming the first peak.

More preferably, the total number of etch pits with a diameter of 2a or more is $\frac{1}{100}$ or less of the number of etch pits forming the first peak.

Supplementary Description 3

The gallium nitride single crystal substrate according to supplementary description 1, wherein the number of etch pits forming the first peak is 50% or more of a total.

More preferably, the number of etch pits forming the first peak is 70% or more of the total.

Supplementary Description 4

The gallium nitride single crystal substrate according to supplementary description 1, wherein when a frequency of the first peak is A, a number of peaks with a frequency of A/10 or more appearing in the histogram is two, including the first peak.

Supplementary Description 5

The gallium nitride single crystal substrate according to supplementary description 1, having a second peak in a diameter range of more than a and less than 2a, wherein a number of etch pits forming the second peak is smaller than a number of etch pits forming the first peak.

Supplementary Description 6

The gallium nitride single crystal substrate according to any one of supplementary descriptions 1 to 5, wherein a density and a histogram of the etch pits are measured from a region with an area of 1 mm$^2$ or more.

What is claimed is:

1. A gallium nitride single crystal substrate, which is a gallium nitride single crystal substrate that has a diameter of 50 mm or more and whose low index crystal plane closest to a main surface is a (0001) plane,
    wherein a density of etch pits when applying etching to the main surface with an alkaline etching solution is less than 1×10$^6$ cm$^{-2}$, and
    among peaks appearing in a histogram of diameters of the etch pits, when a diameter of a first peak appearing on a smallest diameter-side is a, a total number of the etch pits with a diameter of 2a or more is $\frac{1}{10}$ or less of a number of etch pits forming the first peak.

2. A gallium nitride single crystal substrate, which is a gallium nitride single crystal substrate that has a diameter of 50 mm or more and whose low index crystal plane closest to a main surface is a (0001) plane,
    wherein a density of etch pits when applying etching to the main surface with an alkaline etching solution is less than 1×10$^6$ cm$^{-2}$, and
    among peaks appearing in a histogram of diameters of the etch pits, when a peak appearing on a smallest diameter-side is a first peak, the number of etch pits forming the first peak is 50% or more of a total.

3. A gallium nitride single crystal substrate, which is a gallium nitride single crystal substrate that has a diameter of 50 mm or more and whose low index crystal plane closest to a main surface is a (0001) plane,
    wherein a density of etch pits when applying etching to the main surface with an alkaline etching solution is less than 1×10$^6$ cm$^{-2}$, and
    among peaks appearing in a histogram of diameters of the etch pits, when a frequency of a peak appearing on a smallest diameter-side is A, a number of peaks with a frequency of A/10 or more appearing in the histogram is two, including the first peak.

4. A gallium nitride single crystal substrate, which is a gallium nitride single crystal substrate that has a diameter of 50 mm or more and whose low index crystal plane closest to a main surface is a (0001) plane,
    wherein a density of etch pits when applying etching to the main surface with an alkaline etching solution is less than 1×10$^6$ cm$^{-2}$, and
    among peaks appearing in a histogram of diameters of the etch pits, when a diameter of a first peak appearing on a smallest diameter-side is a, having a second peak in a diameter range of more than a and less than 2a, wherein a number of etch pits forming the second peak is smaller than a number of etch pits forming the first peak.

5. The gallium nitride single crystal substrate according to claim 1, wherein a density and a histogram of the etch pits are measured from a region with an area of 1 mm$^2$ or more.

6. The gallium nitride single crystal substrate according to claim 2, wherein a density and a histogram of the etch pits are measured from a region with an area of 1 mm$^2$ or more.

7. The gallium nitride single crystal substrate according to claim 3, wherein a density and a histogram of the etch pits are measured from a region with an area of 1 mm$^2$ or more.

8. The gallium nitride single crystal substrate according to claim 4, wherein a density and a histogram of the etch pits are measured from a region with an area of 1 mm$^2$ or more.

* * * * *